United States Patent
Keller et al.

(10) Patent No.: US 10,295,568 B2
(45) Date of Patent: May 21, 2019

(54) MEASURING DEVICE AND METHOD FOR AUTOMATIC ADJUSTMENT OF CONTRAST IN THE SCREEN DISPLAY

(71) Applicant: Rohde & Schwarz GmbH & Co. KG, Munich (DE)

(72) Inventors: Matthias Keller, Kirchheim (DE); Hagen Eckert, Mering (DE)

(73) Assignee: ROHDE SCHWARZ GMBH & CO. KG, Munich (DE)

( * ) Notice: Subject to any disclaimer, the term of this patent is extended or adjusted under 35 U.S.C. 154(b) by 1077 days.

(21) Appl. No.: 14/345,310

(22) PCT Filed: Feb. 1, 2013

(86) PCT No.: PCT/EP2013/052030
§ 371 (c)(1),
(2) Date: Mar. 17, 2014

(87) PCT Pub. No.: WO2013/113872
PCT Pub. Date: Aug. 8, 2013

(65) Prior Publication Data
US 2014/0358477 A1    Dec. 4, 2014

(30) Foreign Application Priority Data
Feb. 3, 2012  (DE) .................. 10 2012 201 619

(51) Int. Cl.
*G01R 13/00* (2006.01)
*G01R 13/02* (2006.01)
(Continued)

(52) U.S. Cl.
CPC ....... *G01R 13/0227* (2013.01); *G01R 13/029* (2013.01); *G06T 5/009* (2013.01);
(Continued)

(58) Field of Classification Search
CPC .................................................. G01R 13/0227
See application file for complete search history.

(56) References Cited

U.S. PATENT DOCUMENTS 6,240,282 B1    5/2001   Kleider et al.
7,139,426 B2   11/2006   Ivers et al.
(Continued)

FOREIGN PATENT DOCUMENTS

| DE | 199 58 662 A1 | 7/2000 |
| EP | 0952458 A2 | 10/1999 |
| WO | 2009/029448 A1 | 3/2009 |
| WO | 2009/143466 A2 | 11/2009 |

OTHER PUBLICATIONS

Wolfgang Buescher, "DL4YHF's Spectrum Laboratory (short: SpecLab) Manual", Spectrum Lab, Nov. 7, 2011, p. 65, XP-002695498, Retrieved from the Internet: URL: http://web.archive.org/web/20111107092454/http://dl4yhf.ss17.com/speclab/index.htm [retrieved on Apr. 16, 2013].

(Continued)

*Primary Examiner* — John E Breene
*Assistant Examiner* — Jeffrey C Morgan
(74) *Attorney, Agent, or Firm* — Carter, DeLuca & Farrell LLP

(57) ABSTRACT

A measuring device is used to increase a contrast of a plurality of measured values displayed in a spectrogram or spectral histogram and contains a data-acquisition unit, a computer unit and a statistic unit. The data-acquisition unit is embodied to detect a plurality of measured values to be displayed. The statistic unit is embodied to calculate a distribution which contains the frequency of occurrence for every level value of the measured values to be displayed. The computer unit is embodied to specify a dynamic range, over which the contrast extends. In this context, a specified proportion of the level values which image the noise are not used for the specification of the dynamic range.

17 Claims, 8 Drawing Sheets

Figure 1:
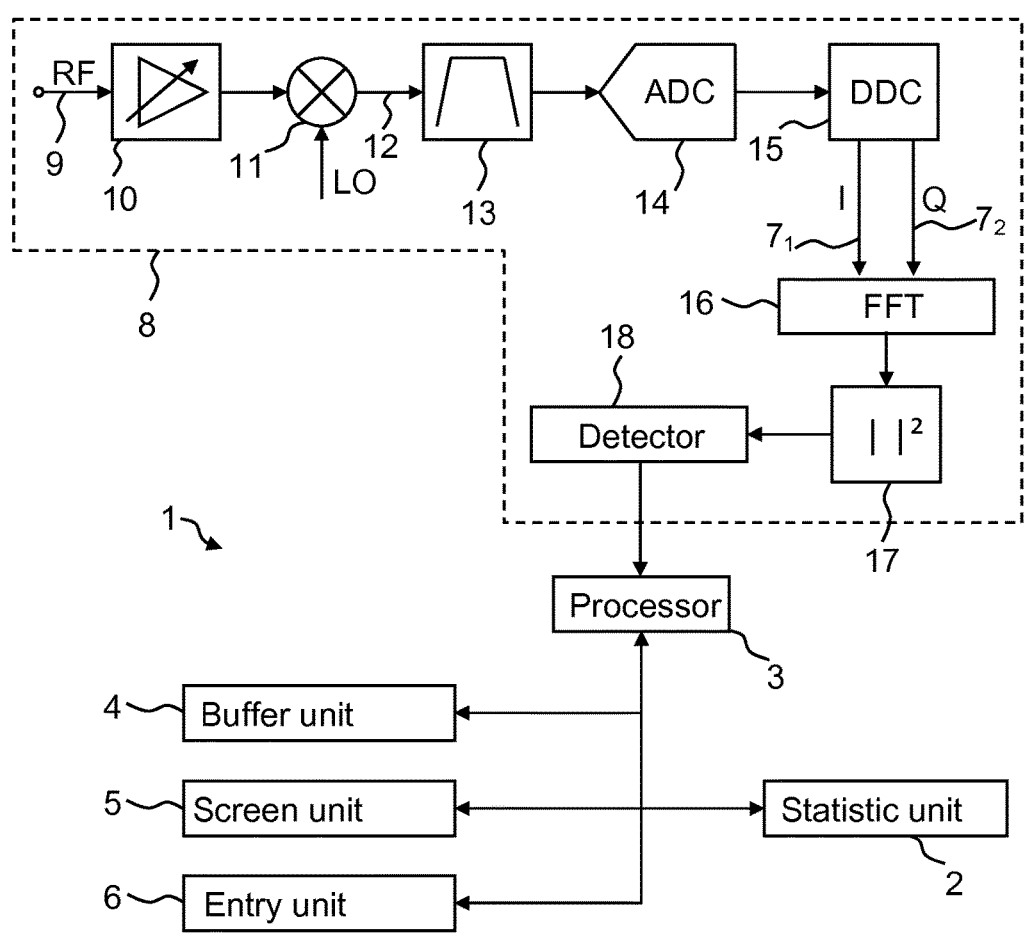

(51) Int. Cl.
*G06T 5/40* (2006.01)
*G06T 5/00* (2006.01)
*G06T 11/20* (2006.01)
*G01R 23/16* (2006.01)

(52) U.S. Cl.
CPC .............. *G06T 5/40* (2013.01); *G06T 11/206* (2013.01); *G01R 23/16* (2013.01)

(56) References Cited

U.S. PATENT DOCUMENTS

| 7,203,339 | B1* | 4/2007 | Nevis | G06T 5/009 |
|---|---|---|---|---|
| | | | | 382/103 |
| 7,512,269 | B2 | 3/2009 | Golan et al. | |
| 2003/0152266 | A1 | 8/2003 | Ivers et al. | |

OTHER PUBLICATIONS

Xu Mankun et al., "A New Time-Frequency Spectrogram Analysis of FH Signals by Image Enhancement and Mathematical Morphology", Image and Graphics, 2007. ICIG 2007. Fourth International Conference on, Aug. 1, 2007 IEEE, XP031131359, pp. 610-615.
International Search Report issued in corresponding application No. PCT/EP2013/052030 dated May 14, 2013.
Lux, Wolfgang: Vorlesung Bildverarbeitung-Kapitel 5-Punktoperationen, Fachhochschule, Duesseldorf, 2006. URL: http://et.fh-duesseldorf.de/c_personen/a_professoren/lux/SB_V_K05.pdf (retrieved on Oct. 11, 2012).
Rohde & Schwarz GmbH & Co. KG, NEUES 203/11, ISSN 0548-3093, Munich, 2011, pp. 50-51.

* cited by examiner

MEASURING DEVICE AND METHOD FOR AUTOMATIC ADJUSTMENT OF CONTRAST IN THE SCREEN DISPLAY

The invention relates to a measuring device and a method for automatic matching of a contrast of a plurality of recorded measured values, especially in a spectrogram display.

Spectrograms provide a display of the time characteristic of the power spectrum of a signal. By preference, the time characteristic of the signal is displayed on the vertical axis, whereas an individual spectral measurement is plotted on the horizontal axis. In this context, the level values can be coded, for example, using colour. New measured values are preferably inserted in the top line, and the remaining measured values are shifted down by one line in each case, thereby explaining the name "waterfall diagram".

A spectrum and a waterfall diagram of a recorded radar signal are shown on pages 50 and 51 of the magazine "NEWS 203/11" by Rohde & Schwarz, ISSN 0548-3093, 2011. In this context, it is disadvantageous that, as a result of its low power level, the actual radar signal is not readily distinguishable from the background noise.

Accordingly, the object of the invention is to provide a measuring device and a method with the possibility of displaying the actual payload signal in a visually enhanced manner for the observer.

The object is achieved with regard to the measuring device according to the invention by the features of the claims. In a further aspect, a computer-program product is provided with program-code means, especially stored on a machine-readable carrier for the implementation of all of the method steps when the program is executed on a computer or a digital-signal processor. Advantageous further developments of the measuring device according to the invention and the method according to the invention are specified in the respective dependent claims.

The measuring device according to the invention is used to increase a contrast in the display of a plurality of measured values displayed in a spectrogram or spectral histogram and provides a data-acquisition unit, a computer unit and a statistic unit, whereas the data-acquisition unit is embodied to register a plurality of measured values to be displayed, whereas the statistic unit is embodied to calculate a distribution which contains the frequency of occurrence for every level value of the measured values to be displayed, and whereas a computer unit is embodied to specify a dynamic range over which the contrast extends, whereas a specified proportion of those level values which image the noise are not used for the specification of the dynamic range.

It is particularly advantageous that a frequency of occurrence is calculated for every level value of the measured values to be displayed. With reference to this frequency of occurrence, it can easily be recognised how frequently given level values occur within the spectrogram or spectral histogram, whereas, in a targeted manner, those level values which image the noise are not used for the adjustment of the contrast. The contrast, which can extend from a very dark colour towards a very light colour, consequently no longer includes those measured values which represent the noise. This means that the actual signal is clearly emphasised by contrast with the measured values which image the noise. Accordingly, it is not relevant how high the actual signal level is, so long as the noise is not used to specify the dynamic range for the contrast.

The method according to the invention is used to increase a contrast in a plurality of measured values displayed on a spectrogram or spectral histogram. Within the method, a plurality of method steps is implemented, whereas, at the start, a plurality of measured values to be displayed is registered. Following this, a calculation of a distribution which contains the frequency of occurrence for every level value of the measured values to be displayed is performed. Finally, an automatic specification of a dynamic range over which the contrast extends is implemented, whereas a specified proportion of those level values which image the noise are not used in the specification of the dynamic range.

With the method according to the invention for increasing a contrast, it is particularly advantageous if those level values which image the noise are not used for the specification of a dynamic range for the contrast. The term dynamic range can be understood to mean, for example, a colour range which images the contrast. This can extend, for example, from a very dark colour to a very light colour. It can also comprise exclusively greyscales or one or more colours. By preference, the dynamic range over which the contrast extends is specified by level values which correspond to the actual payload signal. Accordingly, the actual payload signal is particularly strongly highlighted and is therefore more readily visually recognisable.

Moreover, an advantage is achieved with the measuring device according to the invention if the dynamic range is imaged through the level values of the received measured values and/or if the computer unit is embodied only to consider, in the specification of the dynamic range, level values of which the frequency of occurrence and/or of which the level value is disposed above an adjustable threshold value and/or if the computer unit is embodied to display different level values which specify the dynamic range through different colours and/or through different greyscales and/or through different brightness gradations. It is particularly advantageous if the computer unit considers for the specification of the dynamic range exclusively level values of which the frequency of occurrence and/or level value is disposed above an adjustable threshold value. This ensures that the dynamic range is matched, at least roughly, to the measured signal to be displayed. The fact that the dynamic range is displayed through different colours or different greyscales or different brightness gradations means that the actual measured signal is particularly emphasised.

Additionally, an advantage is achieved with the measuring device according to the invention if a colour characteristic or a greyscale characteristic or brightness-gradation characteristic within the dynamic range has a linear or a parabolic or an exponential or a non-linear course. For example, a parabolic or an exponential course of the dynamic range allows signal components which exceed a given level value to be clearly emphasised by contrast with the other signal components.

Furthermore, with the measuring device according to the invention, an advantage is achieved if the computer unit is embodied to register a change of a resolution bandwidth or a measurement time within the measuring device and to vary the dynamic range over which the contrast extends in such a manner that the contrast for the plurality of measured values displayed in the spectrogram or spectral histogram does not vary. If the resolution bandwidth and/or the measurement time is varied, the frequency of occurrence for every level value and therefore also the displayed colour or brightness sensation is also shifted. Without an automatic correction of the contrast, the actual measured signal could no longer be correctly identified.

Finally, an advantage is achieved with the measuring device according to the invention if the computer unit is embodied to specify the dynamic range over which the contrast extends only over one or more sub-ranges of the spectrogram or spectral histogram. This means that, with the occurrence of several signals which are spaced from one another in frequency, the dynamic range is specified exclusively with reference to the levels which are disposed within a certain frequency range, that is, which are allocated to a signal. Level values outside this frequency range are not used to specify the dynamic range and are not displayed in an emphasised manner. Accordingly, even a weak signal which is adjacent in frequency to a strong signal can be displayed with a strong contrast.

With the method according to the invention, a further advantage is achieved if, in a further method step, a first level value is determined of which the frequency of occurrence is highest. Following this, a lower limit can be specified for the dynamic range, which corresponds to the first level value, or a lower limit can be specified for the dynamic range, which corresponds to a second level value, whereas the second level value is higher than the first level value, and whereas an interval between the first level value and the second level value is adjustable or, or if a lower limit is specified for the dynamic range, which is disposed above a lowest level value and spaced from the latter by an adjustable interval. In the case of a broadband registration of a payload signal, the level value with the highest frequency of occurrence is generally noise. By specifying a lower limit for the dynamic range at the first level value or at a second level value which is higher than the first level value, a significant proportion of the noise can be excluded, which is subsequently not used in the specification of the dynamic range over which the contrast extends. The same also applies if the lower limit is specified above a lowest level value.

Moreover, an advantage is achieved with the method according to the invention if a further method step is implemented, in which the calculated distribution is correlated with at least two buffered distributions and in which the dynamic range over which the contrast extends is specified in such a manner that the latter corresponds to a buffered dynamic range which is linked to the buffered distribution for which the result of the correlation provides the highest value. It is particularly advantageous here that the calculated distribution is compared with the distributions already known. For these known distributions, dynamic ranges have already been buffered, so that the buffered dynamic range for the calculated distribution of which the buffered distribution is most similar to the calculated distribution is used. This allows noise to be eliminated more effectively in the case of known signals, so that the actual payload signal can be displayed even more clearly in the spectrogram or spectral histogram.

Furthermore, an advantage is achieved with the method according to the invention if the plurality of measured values displayed in a spectrogram or spectral histogram images at least one signal to be analysed, and the dynamic range over which the contrast extends is specified in such a manner that the latter corresponds to a buffered dynamic range, which is linked to the buffered signal, whereas the buffered signal provides the same modulation type and/or the same frequency and/or the same bandwidth as the signal to be analysed. In this context, if the type of signal is known, it is particularly advantageous that a dynamic range buffered for the known signal can be used directly. This method step can preferably also be combined with the "correlation" method step, so that the calculated distribution is correlated exclusively with buffered distributions of which the signals provide the same modulation type and/or the same frequency and/or the same signal bandwidth and/or resolution bandwidth.

Figure 2:
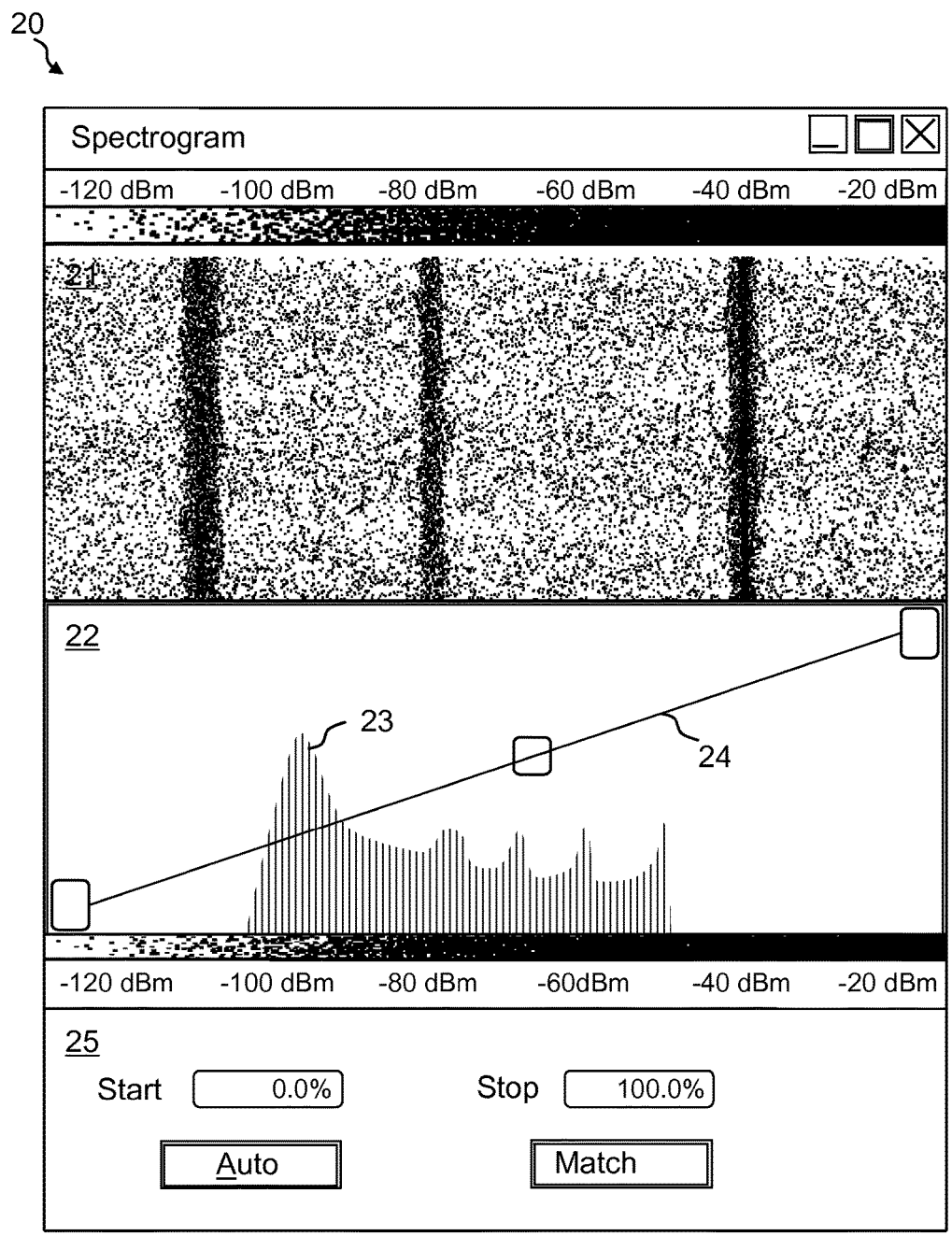
Figure 3:
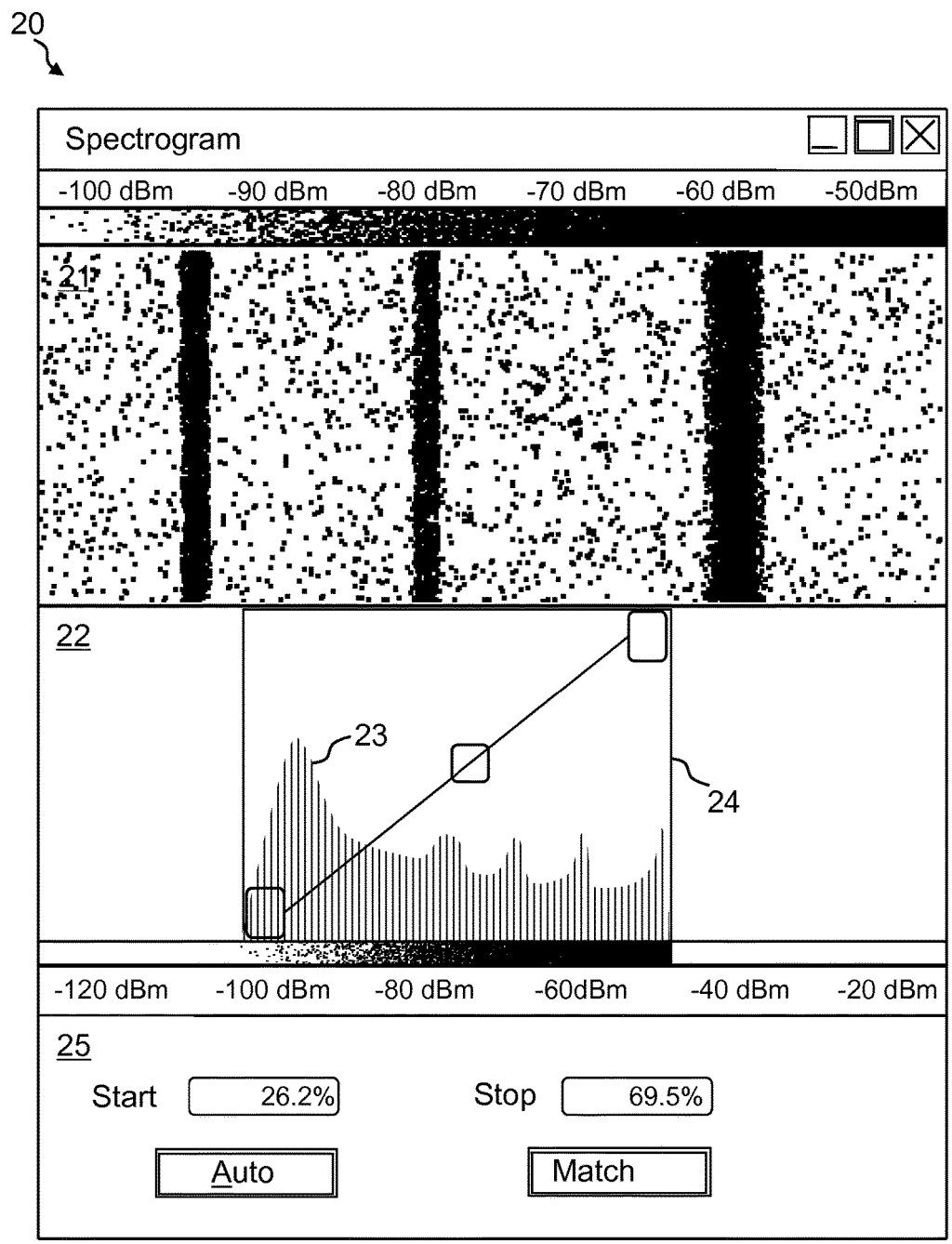
Figure 4:
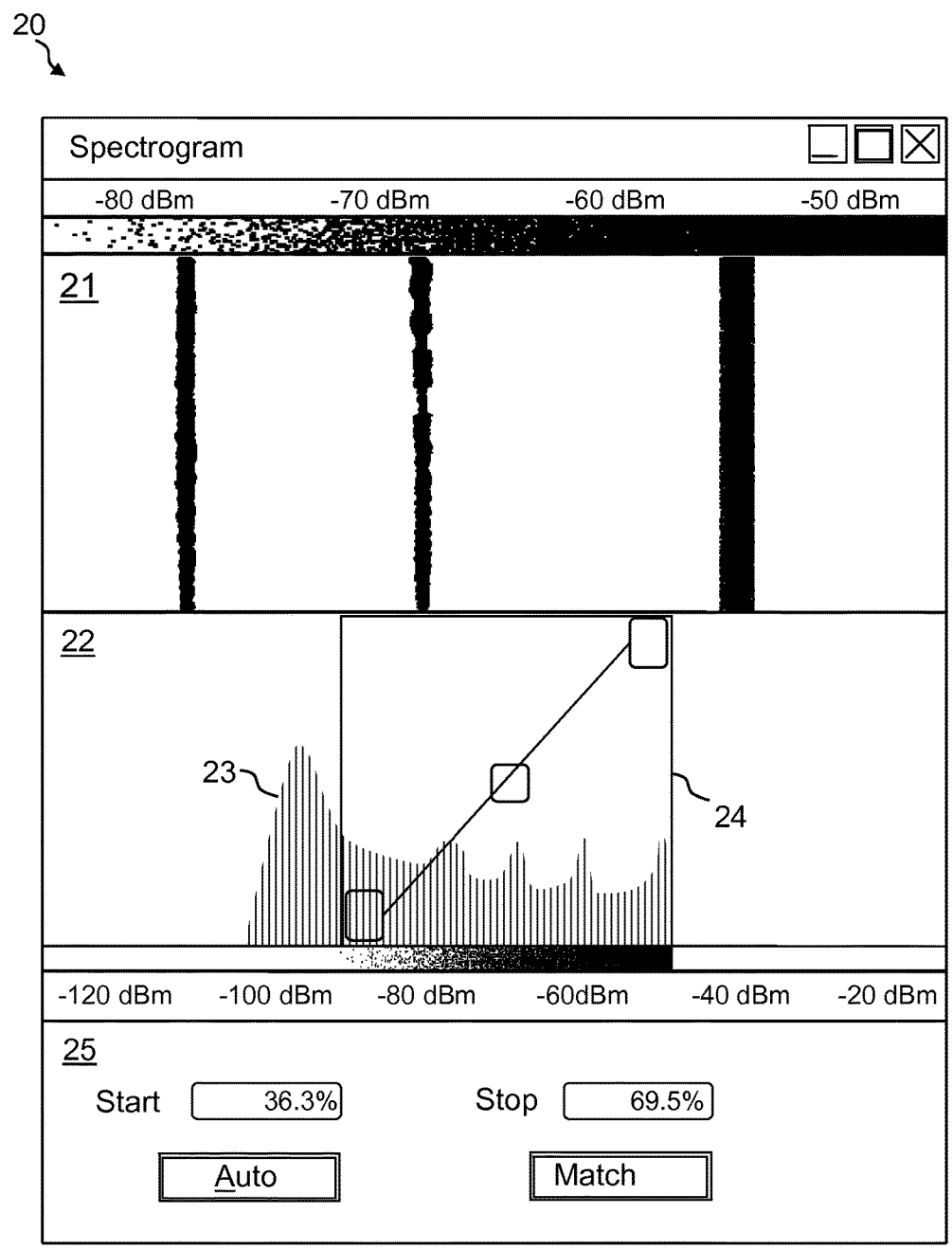
Figure 5A:
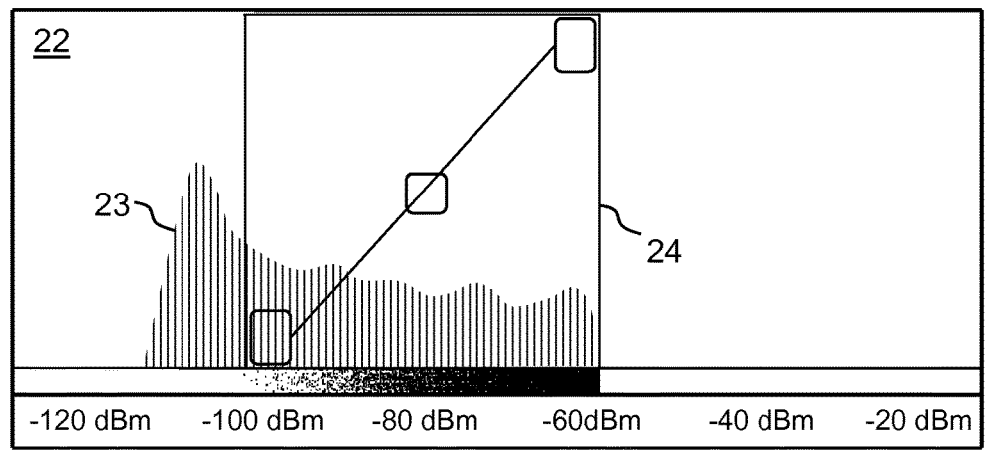
Figure 5B:
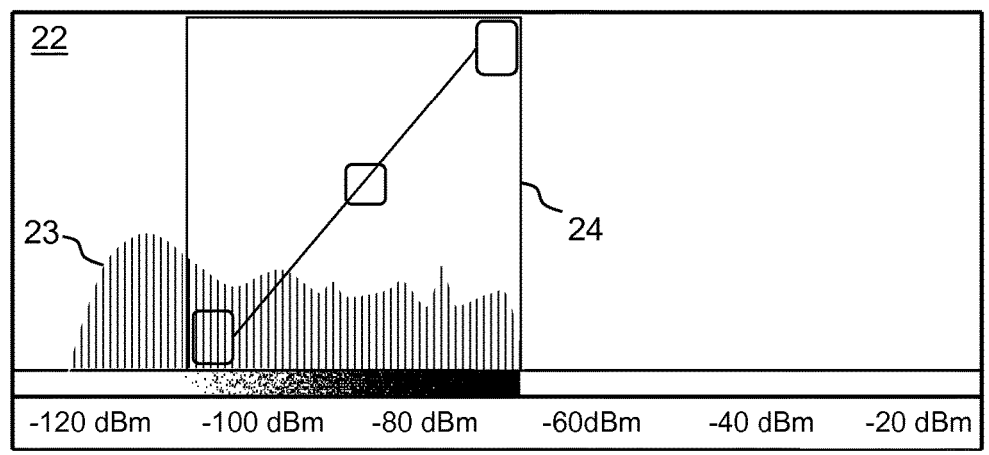
Figure 6:
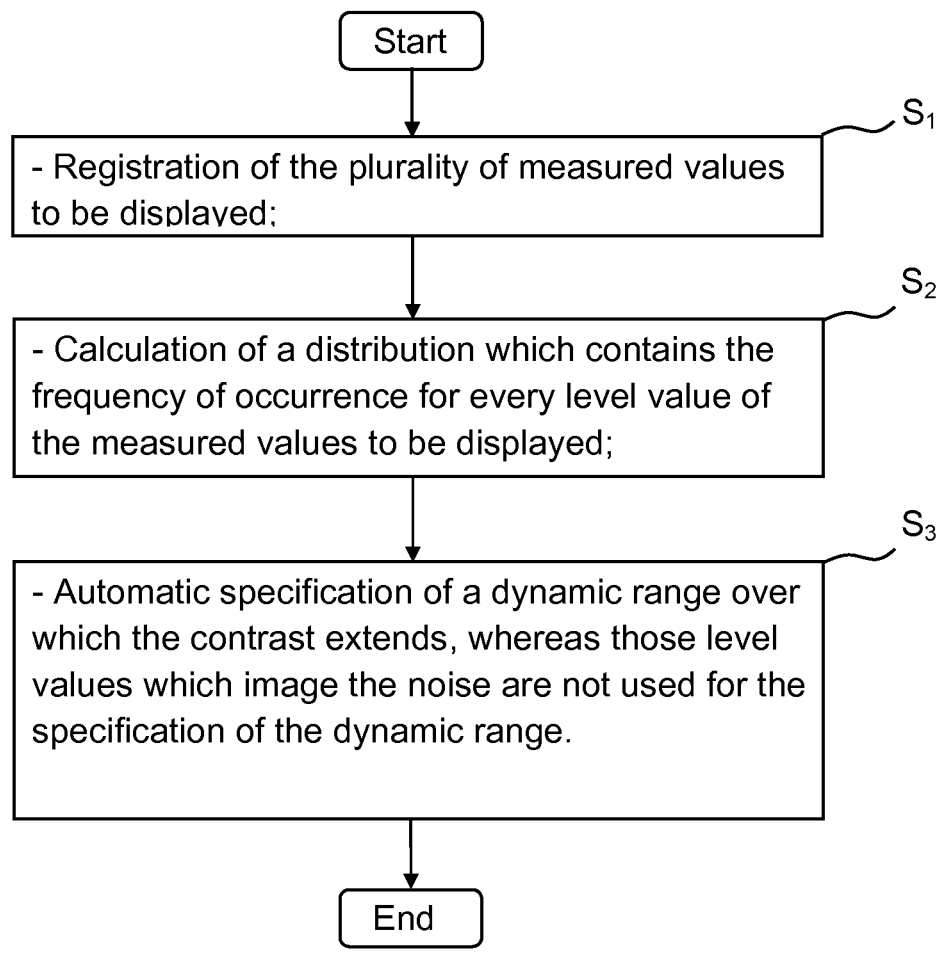
Figure 7:
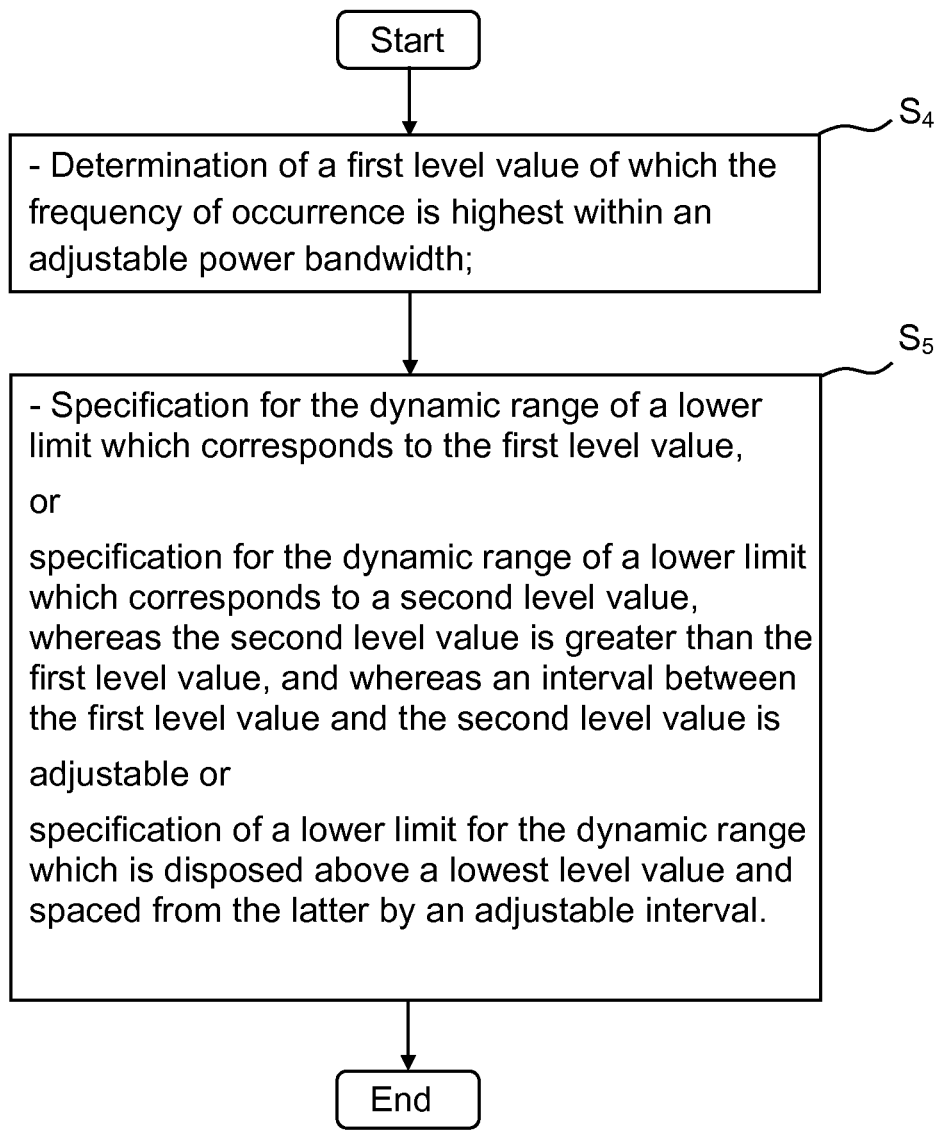
Figure 8:
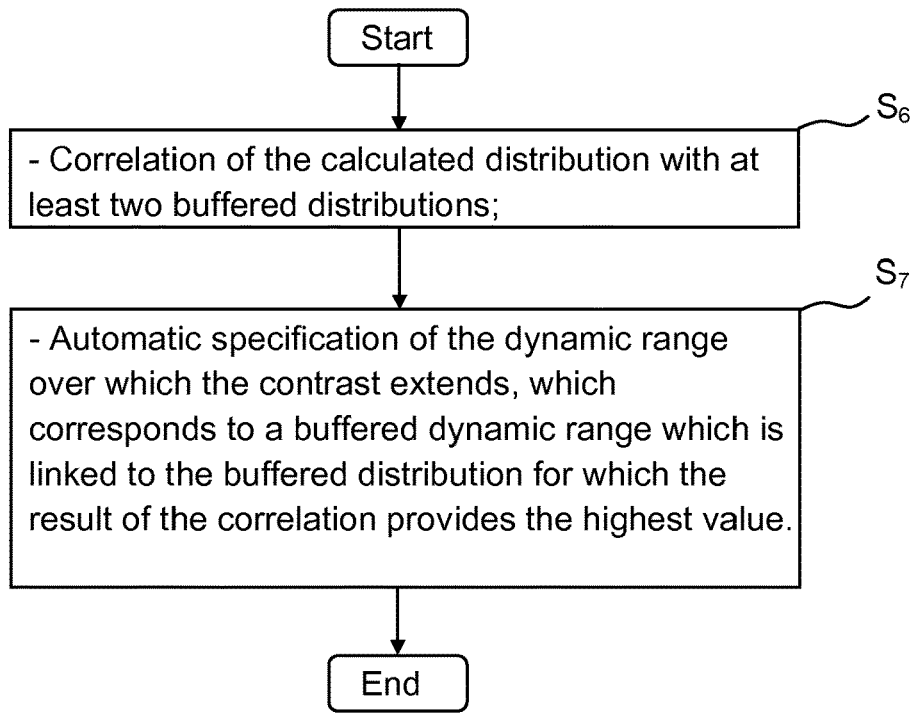
Figure 9:
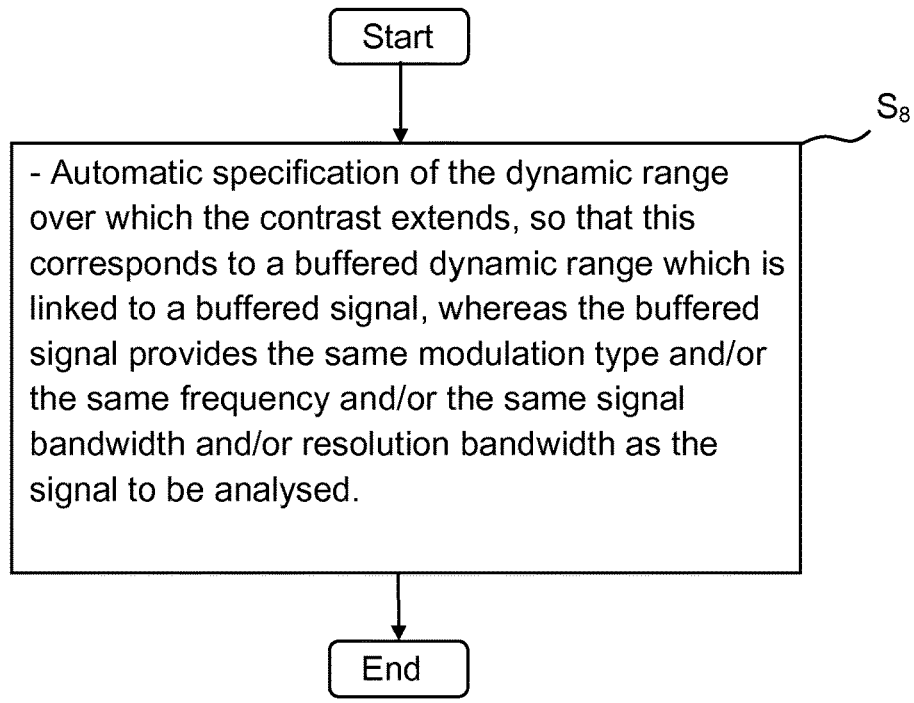

Various exemplary embodiments of the invention are described by way of example below with reference to the drawings. Identical subject matters provide the same reference numbers. In detail, the corresponding figures of the drawings show:

FIG. 1 an exemplary embodiment of a measuring device according to the invention for increasing a contrast of measured values to be displayed;

FIG. 2 a spectrogram in which the registered measured values are displayed, a distribution which indicates the frequency of occurrence of the individual level values, and a dynamic range which determines the contrast;

FIG. 3 a spectrogram in which the registered measured values are displayed with a relatively higher contrast, a distribution which indicates the frequency of occurrence of the individual level values, and a restricted dynamic range;

FIG. 4 a spectrogram in which the registered measured values are displayed with an even greater contrast, a distribution which indicates the frequency of occurrence of the individual level values, and a further restricted dynamic range;

FIG. 5A a distribution which indicates the frequency of occurrence of the individual level values, and a dynamic range which excludes the noise;

FIG. 5B a further distribution which indicates the frequency of occurrence of the individual level values, and a dynamic range which excludes the noise;

FIG. 6 a flow chart of an exemplary embodiment of the method according to the invention which explains that the contrast for the measured values recorded is selected in such a manner that those measured values which image the noise are not registered;

FIG. 7 a flow chart of an exemplary embodiment of a method according to the invention which describes how the limits of the dynamic range which determines the contrast are selected;

FIG. 8 a further flow chart of an exemplary embodiment of the method according to the invention which describes how the limits of the dynamic range, which determines the contrast are selected; and FIG. 9 a further flow chart of an exemplary embodiment of the method according to the invention which describes how the limits of the dynamic range which determines the contrast are selected.

FIG. 1 shows an exemplary embodiment of a block-circuit diagram which describes the structure of the measuring device 1 in greater detail. In this context, the measuring device 1 for increasing a contrast of a plurality of measured values displayed in a spectrogram or spectral histogram of a measured signal $7_1$, $7_2$ to be analysed comprises at least one central data-processing unit 3, which is also referred to as a computer unit 3. The central data-processing unit 3 can comprise one or more processors and/or FPGAs (English: Field Programmable Gate Array; German: im (Anwendungs-)Feld programmierbare (Logik-) Gatter-Anordnung) and/or DSP (English: digital signal processor; German digitaler Signalprozessor). At least one statistic unit 2, a buffer unit 4, a screen unit 5, an entry unit 6 and a data-acquisition unit 18 are connected to the central data-processing unit 3. A spectral histogram is understood to mean a "persistent" histogram (English: persistence), in which successive spectra are shown one above the other, or drawn and coded in colour with the frequency of occurrence.

The at least one buffer unit 4 can be, for example, a main memory and/or a hard disk memory, which is embodied within the measuring device 1 and/or connected to the measuring device 1, for example, via a network port.

As will be explained in greater detail below, the data-acquisition unit 18 connected to the central data-processing unit 3 receives a plurality of measured values which provide a given level value and which image a measured signal $7_1$, $7_2$ to be analysed for a given frequency at a given time. The measured signal $7_1$, $7_2$ to be analysed can be any kind of communications signal, for example, a GSM signal.

In this context, FIG. 1 shows a simplified block-circuit diagram of a signal analyser 8. A high-frequency measured signal 9 to be analysed, for example, a GSM signal, is amplified in its amplitude by an amplifier 10. Following this, the amplified, high-frequency measured signal 9 is mixed down by means of a local-oscillator signal, via a mixer 11, to an intermediate frequency 12. The high-frequency measured signal 9 mixed down to an intermediate frequency 12 is then filtered through a band-pass filter 13 before it is digitised by an analog/digital converter 14. The digitised high-frequency signal is mixed down into the baseband via a digital down converter 15 (English: digital down converter). The measured signal mixed down into the baseband is the measured signal $7_1$, $7_2$ to be analysed, of which the in-phase component (German: gleichphasig) and the quadrature-phase component is present. If the high-frequency measured signal 9 is a measured signal 9 which is transmitted, for instance, from a base station (for example, GSM) instead of an amplifier 10, an attenuation element or a coupler, to the output of which a signal of substantially smaller amplitude is connected, is used.

The measured signal $7_1$, $7_2$ is then supplied to a Fourier transform unit 16, which transforms it into the frequency domain, for example, by means of a fast Fourier transform. By preference, a plurality of parallel-operating, fast-Fourier transform units, of which the calculated frequency spectrum can be superposed one on the other, are used.

The result from the Fourier transform unit 16 is supplied to a modulus unit 17, which calculates a power from the complex voltage values of the Fourier transform unit 16.

The result from the modulus unit 17 is supplied to the data-acquisition unit 18. This data-acquisition unit 18 contains a detector unit which averages a plurality of measured values or selects from a plurality of measured values the maximum value or the minimum value and communicates this to the central data-processing unit 3, whereas the plurality is adjustable.

The statistic unit 2 connected to the central data-processing unit 3, which can also be embodied directly in the data-processing unit 3, calculates a frequency of occurrence for every level value of the measured values to be displayed. In this context, it should be borne in mind that the data-acquisition unit 18 preferably transfers to the central data-processing unit 3 only so many measured values from a given time as the screen unit 5 in the spectrogram can display, preferably on the horizontal axis. However, it is also possible for the data-acquisition unit 18 to transfer to the central data-processing unit 3 more measured values for a discrete time than the screen unit 5 can display. This allows the statistic unit 2 a more accurate calculation of the distribution of the frequency of occurrence.

FIG. 2 shows an exemplary embodiment which explains how the measuring device 1 according to the invention increases the contrast of the measured values to be displayed. FIG. 2 shows a screenshot 20, which can be displayed, for example, on the screen unit 5. The screenshot 20 is subdivided into three regions. The first region shows a spectrogram 21, in which the measured values to be displayed are plotted via the frequency and the time. New measured values are preferably inserted into the top line. The relatively older measured values are then shifted downwards in each case by one cell. For this reason, with regard to the spectrogram 21, reference is also made to a "waterfall diagram". Measured values which provide a high signal level are displayed darker in the display from FIG. 2, whereas measured values with a low signal level are displayed lighter.

It is evident that the spectrogram 21 displays measured values of which the signal levels differ markedly. In this context, the scaling extends from signal levels which provide a power from −20 dBm through to signal levels which provide a power of −120 dBm. Because of the fact that a very broad power range is displayed here, the contrast relating to the actual payload signal is relatively low. As shown in FIG. 2, different level values are displayed by different brightness gradations. However, it is also possible for these to be displayed by different colours or by different greyscales. By preference, different colours are used for different level values.

A second region in the screenshot 20 from FIG. 2 shows a diagram 22 in which a distribution 23 of the individual measured values according to their frequency of occurrence is displayed for the corresponding level values. In this context, the level value, that is, the power of the measured value recorded, is displayed on the horizontal axis. Accordingly, the horizontal axis is scaled from −20 dBm through to −120 dBm. On the vertical axis, the frequency of occurrence for every level value is displayed. The frequency of occurrence here can be related, for example, to 100% or can be subject to a freely selectable scaling.

It is clearly evident that the distribution 23 shows a maximum for level values between −90 dBm and −100 dBm. Furthermore, it is evident that the recorded measured values altogether provide a level value which is disposed between −40 dBm and −100 dBm, whereas the scaling extends from −20 dBm to −120 dBm. The recorded measured values which are displayed in the diagram 22 within the distribution 23 are also displayed in the spectrogram 21. All new measured values registered by the data-acquisition unit 18 according to the exemplary embodiment from FIG. 1 are preferably inserted, as already described, in the top line of the spectrogram 21. Both the spectrogram 21 and also the diagram 22 which contains the distribution 23 are updated for every newly recorded measured value.

In view of the fact that the Fourier transform unit 16 calculates, for example, 250,000 fast-Fourier transforms per second and, for example, 1024 measured values can be displayed in a horizontal line in the spectrogram 21, assuming that the screen unit 5 can display, for example, 30 full images per second, eight or nine registered measured values must be averaged within the data-acquisition unit 18 to form a recorded measured value or, one measured value must be selected from eight or nine registered measured values (max, min).

As already explained, the contrast extends over level values from more than −20 dBm through to −120 dBm, whereas the recorded measured values according to the distribution 23 extend between less than −40 dBm and less than −100 dBm, so that the actual signal is displayed in the spectrogram 21 with a low contrast. The range over which the contrast extends is specified via a dynamic range 24, as shown in the diagram 22. In the exemplary embodiment from FIG. 2, the dynamic range 24 is displayed by a diagonal line at the end of which and/or in the middle of which rectangles are disposed. If the screen unit 5 is a touchscreen, a user can displace these rectangles by tapping them, so that the length of the line is varied and the dynamic range 24 is limited. As will be explained in greater detail below, the dynamic range 24 specifies the contrast, so that the contrast for the actual payload signal $7_1$, $7_2$ can be increased or reduced by varying the dynamic range 24.

Moreover, a third region 25 is embodied in the screen shot 20. In this third region 25, a user can enter the start and the end of the dynamic range 24, for example, by means of a keyboard. As already described, the dynamic range 24 in the diagram 22 is not restricted, so that 0% is displayed for the start value and 100% for the stop value. As will be explained in greater detail below the dynamic range 24 is matched by the measuring device 1 according to the invention via the buttons "auto" and "match", automatically to the distribution 23, or automatically to the actual payload signal $7_1$, $7_2$. A click on the "auto" button ensures that the dynamic range 24 is matched to the distribution 23. A click on the "match" button ensures that the dynamic range 24 is matched to the actual payload signal $7_1$, $7_2$ and at least a specified proportion of those level values which image the noise are specifically not used for the specification of the dynamic range 24.

FIG. 3 shows a spectrogram 21 in which the registered measured values are displayed with a relatively higher contrast, and a diagram 22, in which a distribution 23 which specifies the frequency of occurrence of the individual level values is displayed, whereas a dynamic range 24, over which the contrast extends, is specified to the distribution 23.

It is clearly evident that, in FIG. 3, by contrast with FIG. 2, the contrast no longer extends from −20 dBm through to −120 dBm but is now limited from −50 dBm through to −100 dBm. Level values which are not registered by the dynamic range 24 and which are smaller or larger than the level-value range enclosed by the dynamic range 24, are displayed in a uniform colour, for example, in white, in the exemplary embodiment from FIG. 3. In fact, however, level values which are smaller than the level-value range enclosed by the dynamic range 24, should be displayed differently, that is, with a different colour and/or with a different brightness from those level values which are larger than the level-value range enclosed by the dynamic range 24. These colours should preferably not be contained within the colour range which is used to display the level values which are disposed within the dynamic range 24. If different level values are represented by different colours, those level values which are not enclosed by the dynamic range 24 and are smaller than this are preferably displayed in a very dark colour, especially in black or dark blue. In this case, those level values at the upper end of the dynamic range 24, that is, those level values with a high power, would be displayed with a very light colour, for example, white. With reference to its dimension on the horizontal axis in the diagram 22, on which the various level values are plotted, the scaling of the horizontal axis in the spectrogram 21 always corresponds to the modified dynamic range 24.

As already explained, the dynamic range 24 is automatically matched to the distribution 23, as soon as a user clicks on the "auto" button. In this case, the computer unit 3, that is, the central data-processing unit 3, is embodied to consider in the specification of the dynamic range 24 exclusively level values of which the frequency of occurrence and/or of which the level value is disposed above an adjustable threshold value. This means that, for instance, a measured value, of which the level value is disposed, for example, at approximately −120 dBm, and/or that a further measured value, of which the level value is disposed, for example, at approximately −20 dBm, is not necessarily used for the specification of the dynamic range 24. If these measured values appear only with a very low frequency of occurrence, they are not used for the specification of the dynamic range 24. This frequency of occurrence can be indicated, for example, in absolute values relative to the number of measured values displayed in the spectrogram 21.

As already explained, it is also possible to provide an setting such that level values which are greater than, for example, −30 dBm and smaller than, for example, −110 dBm, are not used for the specification of the dynamic range 24. The computer unit 3, that is, the central data-processing unit 3, updates the dynamic range 24 continuously, that is, maximally with every new measured value which is transferred from the data-acquisition unit 18 to the central data-processing unit 3. By preference, however, the dynamic range 24 is only re-calculated as often as it is possible for the screen unit 5 to display a changed spectrogram 21. Accordingly, in this example, it is sufficient for the central data-processing unit 3, that is, the computer unit 3, to match the dynamic range 24 30 times per second. It is evident that the contrast is significantly increased in the spectrogram 21, and that the actual payload signal $7_1$, $7_2$, which is displayed through the plurality of registered measured values, is significantly highlighted. It is also clearly evident that the scaling of the vertical axis which describes the level value, that is, the power of the measured values to be displayed, has changed. In the third region 25, in which the start value and the end value for the dynamic range 24 are displayed, the changes for the dynamic range 24 are registered. For example, in the following, the start value is 26.2% and the end value 69.5%. However, it is clearly evident that a significant proportion of those level values which image the noise are still used for the specification of the dynamic range 24. The following section will therefore describe in detail how, by means of the measuring device 1 according to the invention, even the above-named level values are no longer included in the calculation of the dynamic range 24.

It is very evident that the dynamic range 24 does not cover the entire distribution 23 within the diagram 22. The "noise bulge" at the lower end of the distribution 23 is eliminated by the dynamic range 24. As already described, it is clearly evident that the contrast is specified exclusively by the dynamic range 24, and that this contrast now extends from approximately −50 dBm through to −90 dBm. The scaling of the vertical axis within the spectrogram 21 is modified corresponding to the new dynamic range 24. It is evident that the actual payload signal $7_1$, $7_2$, which is represented by the recorded measured values, is very clearly identifiable in the spectrogram 21 and displayed with a very high contrast.

In the third region 25, the start value, that is, the value for the lower end of the dynamic range 24 has increased from 26.2% to 36.3%. The change of the dynamic range 24 is implemented, for example, by the user clicking on the "match" button. In the following section, three possibilities are described which can also be combined with one another and which allow a move from the dynamic range 24 set in FIG. 3 to the limited dynamic range 24 shown in FIG. 4.

With the first possibility, the statistic unit 2 is embodied to determine a first level value of which the frequency of occurrence is highest and which is disposed in an adjustable power bandwidth, for example, between −110 dBm and −80 dBm, whereas this adjustable power bandwidth must be selected in such a manner that the device noise is not disposed within it. The values for adjusting the power bandwidth are preferably derived from the buffer unit 4. This ensures that, for instance, if the actual measured signal $7_1$, $7_2$ is, for example, a sinusoidal signal, its frequency of occurrence is disposed above the noise; however, the dynamic range 24 is adjusted starting from the maximum of the noise (local maximum) and not from the overall maximum of the frequency of occurrence. The computer unit 3, that is, the central data-processing unit 3, is embodied to specify a lower limit for the dynamic range 24 which corresponds to this first level value. Assuming that the level value with the highest frequency of occurrence in a given power bandwidth always contains those measured values which image the noise a sufficiently high contrast can be achieved. However, it is also possible for the statistic unit 2 to interpolate the characteristic of the distribution 23 and to specify the first turning point within the characteristic of the distribution 23 starting from the lower end of the dynamic range 24, that is, from the end with the lowest level values, as the level value of which the frequency of occurrence is highest. In this case, the "noise bulge" can be securely identified.

Furthermore, the computer unit 3, that is, the central data-processing unit 3, can also be embodied to specify a lower limit for the dynamic range 24 in such a manner that the latter corresponds to a second level value, whereas the second level value is greater than the first level value, and whereas an interval between the first level value and the second level value is adjustable. The interval between the first level value and the second level value can be loaded from the at least one buffer unit 4, for example, by the computer unit 3, that is, the central data-processing unit 3. The interval can be based, for example, on empirical values, which indicate that a payload signal $7_1$, $7_2$ is not likely at the maximum of the "noise bulge", for example, within the next 10 dB. This factual situation can be based, for example on the adjusted dynamic range 24 as illustrated in FIG. 4.

Finally, the computer unit 3, that is, the central data-processing unit 3, can also be embodied so that a lower limit for the dynamic range 24 is specified in such a manner that it is disposed above a lowest level value and is spaced from the latter by an adjustable interval. A lowest level value is preferably a level value which has exceeded a given set value with regard to its frequency of occurrence, whereas there is no further level value which has also exceeded an adjustable threshold value for the frequency of occurrence and provides a relatively lower level value. Starting from this lowest level value within the distribution 23, the lower limit for the dynamic range 24 can be spaced by an adjustable interval. In this case, it is possible for the lower limit for the dynamic range 24 to provide a relatively lower level value than the level value for which the frequency of occurrence is highest. In the diagram 22 from FIG. 4, the lower limit of the dynamic range 24 would therefore be disposed to the left of the maximum of the distribution 23. However, it is also possible that this interval is selected to be so large that the lower limit of the dynamic range 24 is still disposed to the right of the maximum of the frequency of occurrence of the distribution 23.

A second possibility for specifying the dynamic range 24 is achieved by embodying the computer unit 3, that is, the central data-processing unit 3, in such a manner that it correlates the calculated distribution 23 with at least two buffered distributions and by embodying the computer unit 3 to specify the dynamic range 24 over which the contrast extends to correspond to a buffered dynamic range, whereas the buffered dynamic range is linked to the buffered distribution for which the result of the correlation provides the highest value. In this context, it is frequently the case that the distribution illustrated in the diagram 22, which represents a payload signal $7_1$, $7_2$ of a given type, such as, GSM or UMTS, is similar to a buffered distribution which has been recorded for the same signal type.

This is linked with the fact that the distribution 23 contains a plurality of measured values, which have been recorded over a relatively long period of time. For each of these buffered distributions, a dynamic range is buffered and assigned to it. This buffered dynamic range may have been determined, for example, according to the first possibility described or may also have been adjusted manually by a user at an earlier time. The buffered distributions 23 differ, for example, in their position with reference to the level values and/or in the frequency of occurrence of the individual level values. If a buffered distribution contains a payload signal of the same type as the payload signal $7_1$, $7_2$ to be measured, the shape of the buffered distribution may in fact vary, but the contrast in this context is significantly better adjusted than if the dynamic range 24 were to comprise the entire distribution 23. However, the position of the distribution should not be included in the correlation. In fact, even a buffered distribution which represents a high-power payload signal can be used to determine the "noise bulge" of a low-power payload signal $7_1$, $7_2$ so that the contrast can still be effectively increased.

Moreover, there is a third possibility for adjusting the dynamic range 24. As already explained, the plurality of measured values displayed in the spectrogram 21 is used to image at least one signal $7_1$, $7_2$ to be analysed. In this context, the computer unit 3, that is, the central data-processing unit 3, is embodied to specify the dynamic range 24 over which the contrast extends in such a manner that the latter corresponds to a buffered dynamic range, whereas the buffered dynamic range is buffered for a signal which provides the same modulation type and/or the same frequency and/or the same bandwidth as the signal $7_1$, $7_2$ to be analysed.

As already explained, a plurality of signals which are also linked to a dynamic range can be stored or buffered in the at least one buffer unit 4, so that, with a knowledge of various parameters of the signal $7_1$, $7_2$ to be measured, a dynamic range 24 is adjusted in such a manner that the measured values which image the noise are not used for the specification of this dynamic range 24. Accordingly, it frequently occurs that a user would like to analyse a known signal, for example, a GSM signal, for which the user already knows, for example, the modulation type, the bandwidth and the frequency. In this case, a dynamic range which has already been stored for a signal of the same type can be loaded from the at least one buffer unit 4. This dynamic range is then used for the adjustment of the dynamic range 24.

By preference, with the second possibility and also with the third possibility, the buffered dynamic range is stored with reference to the position of the buffered distribution and/or of the buffered signal. Accordingly, it is evident that the lower limit of the buffered dynamic range is disposed, for example, 20 dB above the lowest level value for which the frequency of occurrence exceeds a threshold value and contributes to the formation of the distribution 23. This means that the dynamic range 24 of the measured distribution 23 can be matched in an appropriate manner, independently of the actual position of the distribution 23.

As already explained, the dynamic range 24 can also be adjusted directly by a user. By preference, this is achieved by tapping and displacing the rectangles when using a touch-sensitive screen unit. As already explained, there is a further rectangle 40, which is preferably embodied in the middle of the dynamic range 24. By displacing this rectangle in its vertical and also in its horizontal position, the line which connects both outer rectangles to one another can be curved. This means that the colour characteristic or the greyscale characteristic or the brightness-gradation characteristic can be modified within the dynamic range 24 from a linear to a parabolic or an exponential or other non-linear characteristic. Accordingly, measured values which provide a given level value can be displayed only very weakly, whereas other measured values, which provide, for example, a relatively higher level value are displayed significantly more strongly. It is also possible to keep back a certain "reserve", so that in the event that a very high level value is measured, this can still be displayed. For example, in the exemplary embodiment from FIG. 4, if another level value with a power of, for example, −20 dBm were to be registered, this could also be displayed safely if a given "reserve" of contrast were held back. The colour brightness can be modulated in this manner.

It is also possible to plot the level values of the measured values in a cumulative distribution (for example, CDF (English: cumulative distribution function) or CCDF (complementary cumulative distribution function; German: komplementare kumulierte Verteilungsfunktion)). In this case, for example, it can be indicated very simply that level values up to a given threshold which are adjustable or which can be loaded from the at least one buffer unit 4, are not considered in the adjustment of the contrast. It may also be that such a cumulative distribution is stored for every buffered distribution and/or for every buffered signal, so that the corresponding threshold value of the stored cumulative distribution is loaded for the corresponding correlation result. The same also applies for the stored cumulative distribution of that signal which is most similar to the measured signal with regard to the signal properties, such as modulation type and/or frequency and/or bandwidth.

FIG. 5A shows a distribution 23 which indicates the frequency of occurrence of the individual level values of the measured values to be displayed and a dynamic range 24 over which the contrast extends and which excludes the noise. By way of difference from the diagram 22 from FIG. 4, the distribution 23 in the diagram 22 from FIG. 5A is displaced towards the relatively lower level values. However, the dynamic range 24 continues to exclude the "noise bulge" of the distribution 23 according to one or more of the previously named possibilities. For example, such a displacement of the distribution 23 can be achieved by reducing the resolution bandwidth of the Fourier transform unit 16. Such a displacement of the distribution 23 can also take place if the measurement time is varied, that is, fewer measured values are averaged with one another. However, once it has been determined, the dynamic range 24 is not based on absolute level values, but preferably on the distribution 23 to be displayed. This dynamic range 24 is adjusted, for example, in such a manner that its lower limit is disposed, for example, 15 dB above the lowest level value of the distribution 23. In this case, the dynamic range 24 is displaced together with the distribution 23 in the case of a variation of the bandwidth of the Fourier transform unit 16, but the lower limit of the dynamic range 24 remains, for example, 15 dB above the lowest, new level value of the distribution 23.

FIG. 5B shows a further distribution 23, which indicates the frequency of occurrence of the individual level values of the measured values to be displayed and contains a dynamic range 24, which specifies the contrast in such a manner that the noise is excluded. As already explained, the position of the distribution 23 can be displaced dependent upon how high the bandwidth of the Fourier transform unit 16 is selected to be, or dependent upon how large the measurement time is selected to be. In this context, the shape of the distribution 23 can also change. However, the dynamic range 24 matches both the new position of the distribution 23 and also the new shape of the distribution 23. If the distribution 23 before the change of the measured parameters extends over a range of, for example, 50 dB and if it extends only over a range of, for example, 40 dB, after the change of the measured parameters, the range over which the dynamic range 24 extends is adapted accordingly, in this case, compressed. In other cases, the dynamic range 24 can also be stretched. In the case of a change of the measured parameters, it is also possible to re-specify the dynamic range 24. The three possibilities already explained are available for this purpose.

The same also applies if the user opens the zoom function in order to analyse certain regions within the measured signal $7_1$, $7_2$ to be analysed more precisely. A manual readjustment of the contrast or a manual readjustment of the colours should, if possible, not take place.

It is also possible for a given frequency range to be selected in the spectrogram 21, whereas the level values of those measured values which are disposed within the frequency range are used for the specification of the contrast. In this case also, the "noise bulge" can be eliminated, that is, the dynamic range 24 which specifies the contrast does not include within the selected frequency range those measured values which image the noise. The remaining measured values outside the selected frequency range are then displayed in a uniform colour, for example, in black or in white, and are accordingly displayed in a uniform manner. Instead of a frequency range, several frequency ranges can also be selected, in fact, it is even possible to select one or more sub-ranges within the spectrogram 21 which are restricted in time and frequency.

FIG. 6 describes a flow chart for the method according to the invention for increasing a contrast of a plurality of measured values displayed in a spectrogram 21 or a spectral histogram comprising a measuring device 1. In a first method step $S_1$, the plurality of measured values to be displayed is registered. This is implemented with the data-acquisition unit 18, which preferably already implements a decimation of the registered measured values in the direction towards the measured values to be displayed. As already explained, this can be achieved with various detectors (min, max, mean). The measured values to be displayed are transferred from the data-acquisition unit 18 to the computer unit 3, that is, the central data-processing unit 3.

Following this, a second method step $S_2$ is performed. In method step $S_2$, a distribution 23 is calculated which contains the frequency of occurrence for every level value of the measured values to be displayed. The calculation of the distribution 23 includes especially only the measured values to be displayed which exceed a given threshold value with regard to their frequency of occurrence and/or their level value.

Following this, method step $S_3$ is performed. In method step $S_3$, a dynamic range 24 over which the contrast extends is specified, whereas a specified proportion of those level values which image the noise are not used for the specification of the dynamic range 24. Level values which are disposed outside the dynamic range 24 are preferably displayed in two different colours, for example, white or black.

FIG. 7 shows a flow chart for the method according to the invention for increasing a contrast which specifies how the limits of the dynamic range 24 which determines the contrast are selected. For this purpose, a method step $S_4$ is performed. Within method step $S_4$, a first level value of which the frequency of occurrence is highest within an adjustable power bandwidth is determined. Such a level value is generally a level value of which the associated measured value images the noise.

Following this, method step $S_5$ is performed. In method step $S_5$, a lower limit is specified for the dynamic range 24 which corresponds to the first level value. It is also possible to specify a lower limit for the dynamic range 24 which corresponds to a second level value, whereas the second level value is larger than the first level value, and whereas an interval between the first level value and the second level value is adjustable. Alternatively, the lower limit for the dynamic range 24 can be specified in that it is disposed above a lowest level value and spaced from this by an adjustable interval. The choice of intervals should be selected in such a manner that, with a high probability, only measured values which image the noise are disposed outside the dynamic range 24.

FIG. 8 shows a further flow chart for the method according to the invention for increasing a contrast which describes how the limits of the dynamic range 24 are selected. For this purpose, a method step $S_6$ is performed. In method step $S_6$, the calculated distribution 23 is correlated with at least two buffered distributions.

Following this, method step $S_7$ is performed. In method step $S_7$, the dynamic range 24 over which the contrast extends is specified in such a manner that it corresponds to the buffered dynamic range which is linked to the buffered distribution for which the result of the correlation provides the highest value. By preference, a plurality of distributions with associated dynamic range are buffered in the at least one buffer unit 4. These distributions correspond, for example, to different measured signals, which differ, for example, with regard to the type of their modulation, their frequency and/or their bandwidth. In this context, by preference, no absolute values over which it should extend are read out from the at least one buffer unit 4 for the dynamic range 24, but relative values are read out, which indicate over which ranges of the calculated distribution 23 it should extend.

FIG. 9 shows another flow chart for the method according to the invention for increasing a contrast which describes how the limits of the dynamic range 24 are selected. For this purpose, method step $S_8$ is performed. In method step $S_8$, the dynamic range 24 over which the contrast extends is specified automatically, so that it corresponds to a buffered dynamic range which is linked to a buffered signal, whereas the buffered signal provides the same modulation type and/or the same frequency and/or bandwidth, as the measured signal $7_1, 7_2$ to be analysed. However, this occurs only if the measured signal $7_1, 7_2$ to be analysed is at least roughly known.

Method steps $S_4, S_5, S_6, S_7, S_8$ are preferably performed within method step $S_3$. Method steps $S_4, S_5, S_6, S_7, S_8$ can also be combined with one another. If the measured signal $7_1, 7_2$ to be analysed is known, the calculated distribution 23 is correlated, in method step $S_6$, exclusively with buffered distributions which are prepared for a buffered signal which provides the same properties as those which are known for the measured signal $7_1, 7_2$ to be analysed.

The invention is not restricted to the exemplary embodiments presented. All of the elements described and/or illustrated can be combined with one another as required within the scope of the invention.

The invention claimed is:

1. A measuring device for increasing a contrast of a plurality of measured values displayed in a spectrogram or a spectral histogram, comprising:
   a data-acquisition unit;
   a computer unit; and
   a statistic unit,
   wherein the data-acquisition unit is configured to register a plurality of measured values to be displayed,
   wherein the statistic unit is configured to calculate a distribution which contains a frequency of occurrence for every level value of the measured values to be displayed,
   wherein the computer unit is configured to specify a dynamic range over which the contrast extends,
   wherein, in specifying the dynamic range, the computer unit is configured to consider level values of which the frequency of occurrence is disposed above an adjustable threshold value,
   wherein a proportion of the level values, which images the noise, is not used for specification of the dynamic range, and
   wherein the computer unit is further configured to modify the display of the level values, which specify the dynamic range, from a linear to a parabolic or an exponential characteristic to allow signal components which exceed a given level value to be emphasized.

2. The measuring device according to claim 1, wherein the dynamic range is formed exclusively through the level values of the measured values received, and/or
   wherein the computer unit is configured to display different level values which specify the dynamic range through different colours and/or through different greyscales and/or through different brightness gradations.

3. The measuring device according to claim 2, wherein a colour characteristic and/or a greyscale characteristic and/or brightness-gradation characteristic within the dynamic range has a linear or a non-linear course.

4. The measuring device according to claim 1, wherein the statistic unit is configured to determine a first level value of which the frequency of occurrence is highest within an adjustable power bandwidth, and
   wherein the computer unit is configured to specify for the dynamic range a lower limit which corresponds to the first level value, or
   wherein the computer unit is configured to specify for the dynamic range a lower limit which corresponds to a second level value, wherein the second level value is larger than the first level value, and wherein an interval between the first level value and the second level value is adjustable, or
   wherein the computer unit is configured to specify for the dynamic range a lower limit which is disposed above a lowest level value and spaced from the latter by an adjustable interval.

5. The measuring device according to claim 1, wherein the computer unit is configured to correlate the calculated distribution with at least two buffered distributions,
   wherein the computer unit is configured to specify the dynamic range over which the contrast extends according to a buffered dynamic range, and wherein the buffered dynamic range is linked to the buffered distribution for which a result of the correlation provides the highest value.

6. The measuring device according to claim 1, wherein the plurality of measured values displayed in the spectrogram or the spectral histogram images includes at least one signal to be analyzed,
wherein the computer unit is configured to specify the dynamic range over which the contrast extends in such a manner that it corresponds to a buffered dynamic range, and
wherein the buffered dynamic range is buffered for a signal which provides a same modulation type and/or a same frequency and/or a same signal bandwidth and/or resolution bandwidth as the signal to be analyzed.

7. The measuring device according to claim 1, wherein the computer unit is configured to register a change of a resolution bandwidth and/or of a measurement time within the measuring device and to modify the dynamic range over which the contrast extends in such a manner that the contrast for the plurality of measured values displayed in the spectrogram or the spectral histogram does not vary.

8. The measuring device according to claim 1, wherein the computer unit is configured to specify the dynamic range over which the contrast extends only over one or more sub-ranges of the spectrogram or the spectral histogram.

9. A method for increasing a contrast of a plurality of measured values displayed in a spectrogram or spectral histogram including a measuring device, comprising:
registering the plurality of measured values to be displayed using a data-acquisition unit;
calculating a distribution, which contains a frequency of occurrence for every level value of the measured values to be displayed using a statistic unit; and
specifying automatically with a computer unit, a dynamic range over which the contrast extends,
wherein, in the automatic specification of the dynamic range, level values of which the frequency of occurrence disposed above an adjustable threshold value are considered,
wherein a specified proportion of those level values, which images the noise, is not used for the specification of the dynamic range, and
modifying the display of the level values, which specify the dynamic range, from a linear to a parabolic or an exponential characteristic to allow signal components which exceed a given level value to be emphasized.

10. The method according to claim 9, wherein the dynamic range is formed through the level values of the measured values received, and/or
wherein different level values which specify the dynamic range are displayed through different colours and/or through different greyscales and/or through different brightness gradations.

11. The method according to claim 10, wherein a colour characteristic and/or a greyscale characteristic and/or a brightness-gradation characteristic within the dynamic range has a linear or a non-linear course.

12. The method according to claim 9, further comprising:
determining a first level value, of which the frequency of occurrence is highest within an adjustable power bandwidth; and
specifying a lower limit for the dynamic range which corresponds to the first level value, or
specifying a lower limit for the dynamic range which corresponds to a second level value, wherein the second level value is greater than the first level value and wherein an interval between the first level value and the second level value is adjustable, or
specifying a lower limit for the dynamic range which is disposed above a lowest level value and spaced from the latter by an adjustable interval.

13. The method according to claim 9, further comprising:
correlating the calculated distribution with at least two buffered distributions; and
specifying automatically the dynamic range over which the contrast extends, which corresponds to a buffered dynamic range which is linked to the buffered distribution for which the result of the correlation provides the highest value.

14. The method according to claim 9, wherein the plurality of measured values displayed in the spectrogram or the spectral histogram images includes at least one signal to be analyzed, the method further comprising specifying automatically the dynamic range over which the contrast extends, so that it corresponds to a buffered dynamic range which is linked to a buffered signal,
wherein the buffered signal provides a same modulation type and/or a same frequency and/or a same signal bandwidth and/or a resolution bandwidth as the signal to be analyzed.

15. The method according to claim 9, wherein in the case of a change of a resolution bandwidth and/or a measurement time, the determining step, the specifying step, the correlating step, and the automatic specification step are performed again, so that the contrast of the plurality of measured values displayed in the spectrogram or the spectral histogram does not vary.

16. The method according to claim 9, wherein the determining step, the specifying step, the correlating step, and the automatic specification step for the dynamic range over which the contrast extends are also used selectively for one or more sub-ranges of the spectrogram or the spectral histogram.

17. A computer-program product with program-code stored on a machine-readable medium for implementing the method according to claim 9 when the program-code is executed on a computer or a digital signal processor.

* * * * *